(12) United States Patent
Uzoh

(10) Patent No.: US 11,244,920 B2
(45) Date of Patent: Feb. 8, 2022

(54) METHOD AND STRUCTURES FOR LOW TEMPERATURE DEVICE BONDING

(71) Applicant: Invensas Bonding Technologies, Inc., San Jose, CA (US)

(72) Inventor: Cyprian Emeka Uzoh, San Jose, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/715,532

(22) Filed: Dec. 16, 2019

(65) Prior Publication Data

US 2020/0194396 A1 Jun. 18, 2020

Related U.S. Application Data

(60) Provisional application No. 62/781,255, filed on Dec. 18, 2018.

(51) Int. Cl.
*H01L 23/00* (2006.01)
*H01L 25/065* (2006.01)
*H01L 25/00* (2006.01)

(52) U.S. Cl.
CPC .............. *H01L 24/20* (2013.01); *H01L 24/03* (2013.01); *H01L 24/05* (2013.01); *H01L 24/19* (2013.01); *H01L 24/82* (2013.01); *H01L 25/0657* (2013.01); *H01L 25/50* (2013.01); *H01L 2224/80895* (2013.01)

(58) Field of Classification Search
CPC ......... H01L 24/20; H01L 24/03; H01L 24/19; H01L 24/82; H01L 24/05; H01L 25/0657; H01L 25/50; H01L 2224/80895; H01L 2225/06524
See application file for complete search history.

(56) References Cited

U.S. PATENT DOCUMENTS

| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |

(Continued)

FOREIGN PATENT DOCUMENTS

WO 2005-043584 A2 5/2005

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

(Continued)

*Primary Examiner* — Kyoung Lee
*Assistant Examiner* — Christina A Sylvia
(74) *Attorney, Agent, or Firm* — Knobbe, Martens, Olson & Bear LLP

(57) ABSTRACT

Dies and/or wafers including conductive features at the bonding surfaces are stacked and direct hybrid bonded at a reduced temperature. The surface mobility and diffusion rates of the materials of the conductive features are manipulated by adjusting one or more of the metallographic texture or orientation at the surface of the conductive features and the concentration of impurities within the materials.

13 Claims, 8 Drawing Sheets

(56) References Cited

U.S. PATENT DOCUMENTS

| | | |
|---|---|---|
| 5,413,952 A | 5/1995 | Pages et al. |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,516,727 A | 5/1996 | Broom |
| 5,610,431 A | 3/1997 | Martin |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,660,564 B2 | 12/2003 | Brady |
| 6,667,225 B2 | 12/2003 | Hau-Riege et al. |
| 6,828,686 B2 | 12/2004 | Park |
| 6,837,979 B2 | 1/2005 | Uzoh et al. |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,962,835 B2 | 11/2005 | Tong et al. |
| 6,974,769 B2 | 12/2005 | Basol et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,126,212 B2 | 10/2006 | Enquist et al. |
| 7,193,423 B1 | 3/2007 | Dalton et al. |
| 7,354,798 B2 | 4/2008 | Pogge et al. |
| 7,485,968 B2 | 2/2009 | Enquist et al. |
| 7,750,488 B2 | 7/2010 | Patti et al. |
| 7,803,693 B2 | 9/2010 | Trezza |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,093,350 B2 | 7/2015 | Endo et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,368,866 B2 | 6/2016 | Yu |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,075 B1* | 1/2017 | Baloglu .............. H01L 24/05 |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,784,191 B2 | 9/2020 | Huang et al. |
| 10,840,205 B2 | 11/2020 | Fountain, Jr. et al. |
| 10,923,408 B2 | 2/2021 | Huang et al. |
| 11,004,757 B2 | 5/2021 | Katkar et al. |
| 11,011,494 B2 | 5/2021 | Gao et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0084414 A1 | 5/2004 | Sakai et al. |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |

(56) References Cited

U.S. PATENT DOCUMENTS

| | | | |
|---|---|---|---|
| 2008/0073795 A1* | 3/2008 | Kohl | H01L 24/10 257/774 |
| 2008/0122092 A1 | 5/2008 | Hong | |
| 2009/0197408 A1 | 8/2009 | Lehr et al. | |
| 2009/0200668 A1 | 8/2009 | Yang et al. | |
| 2011/0074040 A1 | 3/2011 | Frank et al. | |
| 2012/0013013 A1* | 1/2012 | Sadaka | H01L 24/28 257/773 |
| 2012/0211894 A1 | 8/2012 | Aoyagi | |
| 2012/0212384 A1 | 8/2012 | Kam et al. | |
| 2012/0252189 A1* | 10/2012 | Sadaka | H01L 24/05 438/455 |
| 2013/0020704 A1 | 1/2013 | Sadaka | |
| 2013/0221527 A1 | 8/2013 | Yang et al. | |
| 2013/0320556 A1 | 12/2013 | Liu et al. | |
| 2014/0175655 A1 | 6/2014 | Chen et al. | |
| 2014/0191418 A1* | 7/2014 | Cheng | H01L 24/83 257/777 |
| 2014/0225795 A1 | 8/2014 | Yu | |
| 2014/0252635 A1 | 9/2014 | Tran et al. | |
| 2014/0264948 A1 | 9/2014 | Chou et al. | |
| 2015/0064498 A1 | 3/2015 | Tong | |
| 2015/0108644 A1 | 4/2015 | Kuang et al. | |
| 2015/0206823 A1 | 7/2015 | Lin et al. | |
| 2016/0049384 A1* | 2/2016 | Lu | H01L 23/562 257/737 |
| 2016/0343682 A1 | 11/2016 | Kawasaki | |
| 2017/0162535 A1* | 6/2017 | Rinne | H01L 24/81 |
| 2017/0194271 A1 | 7/2017 | Hsu et al. | |
| 2018/0175012 A1 | 6/2018 | Wu et al. | |
| 2018/0182639 A1 | 6/2018 | Uzoh et al. | |
| 2018/0182665 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0273377 A1 | 9/2018 | Katkar et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0096741 A1 | 3/2019 | Uzoh et al. | |
| 2019/0115277 A1 | 4/2019 | Yu et al. | |
| 2019/0131277 A1 | 5/2019 | Yang et al. | |
| 2019/0198407 A1 | 6/2019 | Huang et al. | |
| 2019/0198409 A1 | 6/2019 | Katkar et al. | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0126906 A1 | 4/2020 | Uzoh et al. | |
| 2020/0227367 A1 | 7/2020 | Haba et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0365575 A1 | 11/2020 | Uzoh et al. | |
| 2020/0371154 A1 | 11/2020 | DeLaCruz et al. | |
| 2020/0395321 A1 | 12/2020 | Katkar et al. | |
| 2021/0098412 A1 | 4/2021 | Haba et al. | |
| 2021/0181510 A1 | 6/2021 | Katkar et al. | |
| 2021/0193603 A1 | 6/2021 | Katkar et al. | |
| 2021/0193625 A1 | 6/2021 | DeLaCruz et al. | |
| 2021/0242152 A1 | 8/2021 | Fountain, Jr. et al. | |

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2-SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(l), 6 pages.

Plobi et al., "Wafer Direct Bonding: Tailoring Adhesion Between Brittle Materials," Materials Science and Engineering Review Journal, 1999, 88 pages.

Liu, C.-M. et al. Low-temperature direct copper-to-copper bonding enabled by creep on (111) surfaces of nanotwinned Cu. Sci. Rep. 5, 9734; doi: 10.1038/srep09734 (2015).

Mott et al., "Synthesis of Size-Controlled and Shaped Copper Nanoparticles", Lanmuir, vol. 23, No. 10, 2007.

Akolkar, R., "Current status and advances in Damascene Electrodeposition," Encyclopedia of Interfacial Chemistry: Surface Science and Electrochemistry, 2017, 8 pages.

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, pp. P81-P86.

Ganesan, Kousik, "Capable copper electrodeposition process for integrated circuit—substrate packaging manufacturing," A dissertation presented in partial fulfillment of the requirments for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrustion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.

Huang, Q., "Effects of impurity elements on isothermal grain growth of electroplated copper," Journal of The Electrochemical Society, 2018, vol. 165, No. 7, pp. D251-D257.

Huang, Q., "Impurities in the electroplated sub-50 nm Cu lines: The effects of the plating additives," Journal of The Electrochemical Society, 2014, vol. 161, No. 9, pp. D388-D394.

Jiang, T. et al., "Plasticity mechanism for copper extrusion in through-silicon vias for three-dimensional interconnects," Applied Physics Letters, 2013, vol. 103, p. 211906-1-211906-5.

Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.

Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.

Liu, Chien-Min et al., "Effect of grain orientations of Cu seed layers on the growth of <111>-oriented nanotwinned Cu," Scientific Reports, 2014, vol. 4, No. 6123, 4 pages.

Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.

Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.

(56) References Cited

OTHER PUBLICATIONS

Saraswat, Stanford Presentation, Cu Interconnect slides, web page web.stanford.edu/class/ee311/NOTES/Cu_Interconnect_Slides.pdf, 19 pages.
Song, Xiaohui, "Atomic study of copper-copper bonding using nanoparticles," Journal of Electronic Packaging, Jun. 2020, vol. 142, 5 pages.
Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.
Swingle, Karen D., "Nanograin Copper Deposition Using an Impinging Jet Electrode," A Thesis submitted in partial satisfaction of the requirements of the degree of Master of Science, University of California, San Diego, 2013, 102 pages.
Takahashi, K. et al., "Transport phenomena that control electroplated copper filling of submicron vias and trenches," Journal of The Electrochemical Society, 1999, vol. 146, No. 12, pp. 4499-4503.
Zheng, Z. et al., "Study of grain size effect of Cu metallization on interfacial microstructures of solder joints," Microelectronics Reliability, 2019, vol. 99, pp. 44-51.
Parthasaradhy, N.V., "Practical Electroplating Handbook," 1989, Prentice-Hall, Inc., pp. 54-56.

\* cited by examiner (F)

(G)

METHOD AND STRUCTURES FOR LOW TEMPERATURE DEVICE BONDING

PRIORITY CLAIM AND CROSS-REFERENCE TO RELATED APPLICATION

This application claims the benefit under 35 U.S.C. § 119(e)(1) of U.S. Provisional Application No. 62/781,255, filed Dec. 18, 2018, which is hereby incorporated by reference in its entirety.

FIELD

The following description relates to processing of integrated circuits ("ICs"). More particularly, the following description relates to techniques for packaging dies or wafers, and other microelectronic assemblies.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The direct dielectric bonding techniques include a spontaneous covalent bonding process that takes place at ambient conditions when two prepared dielectric surfaces are brought together, without adhesive or an intervening material, and the hybrid bonding technique adds direct metal-to-metal bonds of respective metallic bond pads at the bonding surfaces of the respective dies or wafers, also without an intervening material, forming unified conductive structures (see for example, U.S. Pat. Nos. 6,864,585 and 7,485,968, which are incorporated herein in their entirety). Heated annealing of the metallic bond pads may be used to augment the metal-to-metal bonds.

Respective mating surfaces (i.e., bonding surfaces) of the bonded dies or wafers (which may comprise an insulating material such as an oxide, for example) often include embedded conductive interconnect structures (which may be metal), or the like. In some examples, the bonding surfaces are arranged and aligned so that the conductive interconnect structures from the respective surfaces are joined during the bonding. The conductive interconnect structures may be formed by damascene techniques, for example, and may include structures having varying widths and sizes. The joined interconnect structures form continuous conductive interconnects (for signals, power, etc.) between the stacked dies or wafers. One or more bonding surfaces of the dies that include the embedded interconnect structures is usually planarized (using chemical-mechanical polishing (CMP), or the like) to prepare the surface(s) for bonding.

Double-sided dies or wafers can be similarly formed and prepared for stacking and bonding, where both sides of the dies or wafers will be bonded to other substrates, wafers, or dies, such as with multiple die-to-die, die-to-wafer, or wafer-to-wafer applications. Preparing both sides of the die or wafer includes finishing both surfaces to meet dielectric roughness specifications and metallic layer (e.g., copper, etc.) recess specifications. The hybrid bonding surfaces may be prepared for bonding with another die, wafer, or other substrate using a CMP process, plasma processes, wet and dry cleaning methods, or the like.

There can be a variety of challenges to implementing stacked die and wafer arrangements. When bonding stacked dies or wafers using a direct bonding or hybrid bonding technique, it is usually desirable that the surfaces of the dies or wafers to be bonded be extremely flat, smooth, and clean. For instance, in general, the surfaces should have a very low variance in surface topology (i.e., nanometer scale variance), so that the surfaces can be closely mated to form a lasting bond. The low variance in surface topology at the bonding surfaces allows the insulator material from each of the dies or wafers to bond at low temperatures (e.g., room temperature or less than 37 degrees C.), when they are brought into contact with each other. However, heated annealing (at least 300 degrees C.) is often used to join the conductive interconnect structures.

The use of higher temperatures for annealing can be damaging to applications that are sensitive to these temperatures. For example, many applications that include chip packaging, including 3D packages and other stacked arrangements, are not able to withstand the high temperatures. Further, epoxies, adhesives, and other package components and materials may also be altered by the high temperatures. This can limit the use of direct hybrid bonding in these applications that could benefit from its performance advantages.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
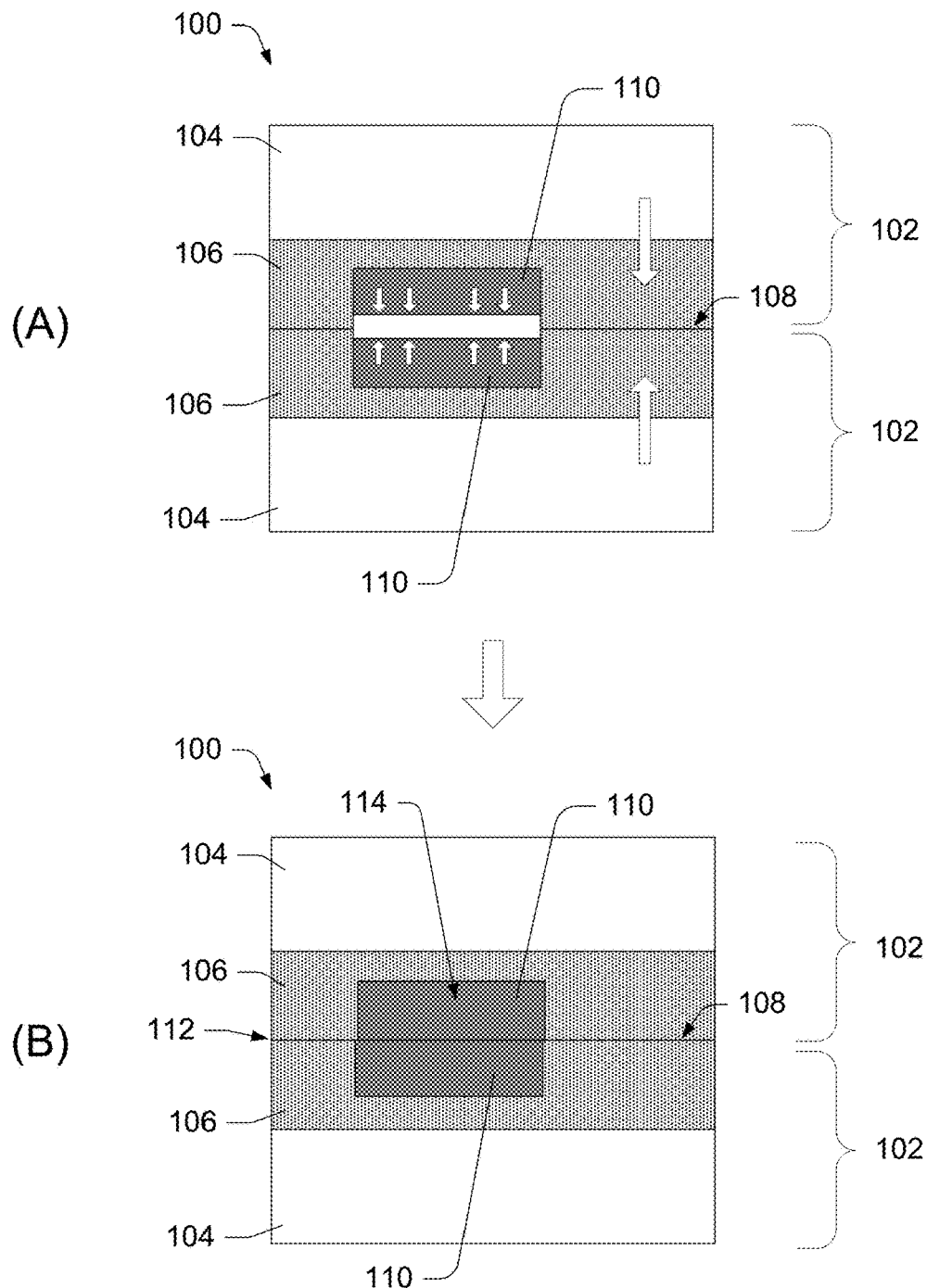
FIG. 1 shows a sequence of example stacking and bonding of dies or wafers, according to various embodiments.

Polycrystalline materials such as metals and other conductive materials are made up of grains separated by grain boundaries. The grains at the surface of a conductive interconnect structure (including the size, quantity, and orientation of the grains) determine the texture of the surface, which can determine the mobility of the atoms of the material at the surface. The size, quantity, and orientation of the grains may be altered by altering the energy or conditions of the materials. For instance, the application of heat to the material may result in recrystallization of the material and grains having a larger size, with increased surface mobility of the atoms of the material. Grain growth occurs when grain boundaries move, with adjacent grains growing into each other. Different grain sizes and properties can be achieved by either allowing heated material to cool slowly or causing the material to rapidly cool.

Another way to manipulate the grain size of a material is to introduce additional materials or impurities into the material. Accordingly, forming alloys (metals combined with a predetermined quantity of other metals or non-metals, e.g., impurities) can result in smaller grain sizes and materials with greater strength and reduced surface mobility, as well as other desired properties.

In general, increasing the grain size of a material reduces its strength but makes it more ductile and malleable. Further, larger grain sizes exhibit greater surface mobility. In contrast, decreasing the grain size of a material increases strength but makes it more brittle, and reduces the surface mobility of the atoms of the material.

When bonding conductive interconnect structures together during direct hybrid bonding, the grains of the conductive materials of the interconnect structures (copper or copper alloy, for example) mate to form a bond. Opposite surfaces with compatible textures (e.g., size, quantity, and orientation of the grains) may mate more closely.

The textures of the surfaces of the respective interconnect structures and the surface mobility of the atoms at each of the surfaces can determine the temperature at which a reliable bond may occur. For instance, the surface mobility can determine the rate of diffusion at the bond line between the conductive interconnects being bonded. While higher temperatures can increase surface mobility and the diffusion rate of copper or a copper alloy, achieving greater surface mobility and diffusion at lower temperatures is desirable, since it can extend the range of potential device applications of direct hybrid bonding and improve manufacturing efficiency. For example, package-type applications, assemblies that use epoxies, have filled or unfilled polymeric materials, or opposing substrates with different coefficients of thermal expansion (CTE), and the like, can benefit from lower processing temperatures.

In various implementations, innovative techniques and devices are disclosed that improve bonding of conductive materials (such as copper and copper alloys, for example), such as with embedded conductive interconnect structures, at lower temperatures (<220° C.) for direct hybrid bonding applications. In the implementations, one or both of the conductive surfaces to be bonded are formed or prepared with predetermined characteristics including: surface roughness, the thickness of the conductive layer, the metallographic texture or orientation of the conductive layer, the concentration of impurities within the conductive layer, amongst others, which can influence surface mobility of the atoms at the bonding surfaces and result in reliable bonds at lower temperatures. Greater surface mobility or faster moving atoms at one or both of the bonding surfaces can result in reliable bonds between conductive interconnect structures at comparatively lower temperatures, for example, bonding at temperatures below 220° C. (rather than higher temperatures, such as 300° C. and above).

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, passive elements, MEMS (Micro-Electro Mechanical Systems) components, packaged components, structures (e.g., wafers, panels, boards, PCBs, etc.), and the like, that may be integrated and coupled to interface with each other, with external circuits, systems, carriers, and the like. Each of these different components, circuits, groups, packages, structures, and the like, can be generically referred to as a "microelectronic component" or "microelectronic assembly." For simplicity, unless otherwise specified, components being bonded to another component will be referred to herein as a "die."

Example Process

FIG. 1 illustrates an example sequence of stacking and bonding dies or wafers, according to various embodiments. As mentioned above, for convenience, the generic term "die 102" will be used hereinafter to represent dies, wafers, and other substrates that may be involved in direct bonding operations.

Blocks A and B of the sequence of FIG. 1 show cross-sectional profile views of stacked and direct bonded dies, according to an embodiment. In the example shown, a stack 100 (or microelectronic assembly 100) is formed by stacking and bonding (hybrid bonding without adhesive, for example) a predetermined quantity of dies 102 (e.g., any quantity of dies 102 desired). In an alternative embodiment, the stack 100 is formed by stacking and bonding (hybrid bonding without adhesive, for example) a plurality of wafers, or one or more dies with wafers, which may then be singulated into the stack 100 of dies 102 shown in FIG. 1.

Dies 102 (or wafers) may be formed using various techniques, to include a base substrate 104 and one or more insulating or dielectric layers 106. For example, the dies 102 shown at FIG. 1 may represent single or double-sided dies 102, having an insulating layer 106 on one or both surfaces of the base layer 104. The reference "die 102" as used herein includes both single and double-sided dies and wafers, unless otherwise specified.

The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like.

Bonding surfaces 108 of the dies 102 can include conductive features 110, such as TSVs, traces, pads, and interconnect structures, for example, embedded into the insulating layer 106, and which may be coupled to one or more metallization layers (not shown for clarity). Embedded conductive traces that extend partially into the dielectric substrate 106 below the prepared surface 108 may be used to electrically couple the conductive features 110 to desired components throughout the die 102. The conductive features 110 can be arranged so that the conductive features 110 from respective bonding surfaces 108 of opposing devices 102 can be mated and joined during bonding, if desired. The joined (e.g., bonded) conductive features 110 can form continuous conductive interconnects 114 (for signals, power, ground, etc.) between stacked devices.

Conductive features 110 may be comprised of a conductive material, such as a metal or an alloy, or a combination of conductive materials. In some embodiments, copper or gold or their alloys may be used to form conductive features 110. The material of conductive features 110 may also include some impurities, such as carbon, oxygen, nitrogen, sulfur, and so forth, which may typically be at a concentration below 15 ppm.

As shown at block A, the sequence includes bringing two dies 102 together, and joining the dies 102 at the bonding surfaces 108 of the dies 102. In the direct bonding process, the insulating layer 106 of each die 102 freely bonds to the other insulating layer 106 when brought into contact with each other at room temperature, without an adhesive or any other intervening material. Preparation of the bonding surfaces 108 by planarization (as well as with other process steps, if desired) can facilitate the instantaneous bonding of the insulating layers 106.

Heat is often applied (usually at least 300 degrees C. for smaller structures) to cause the material (e.g., copper) of associated embedded conductive features 110 to expand (based on the coefficient of thermal expansion (CTE) of the material) and to contact each other across (or on either side of) the bond line 112 (as shown at block B). The heated annealing of the conductive features 110 causes them to join into a single conductive interconnect 114.

However, as discussed above, some product applications, such as packaged dynamic random access memory (DRAM) components, require low thermal budgets. Accordingly, the high annealing temperatures used to join the conductive features 110 may damage the components. Processes that use lower temperatures are disclosed below.

Example Embodiments

Figure 2:
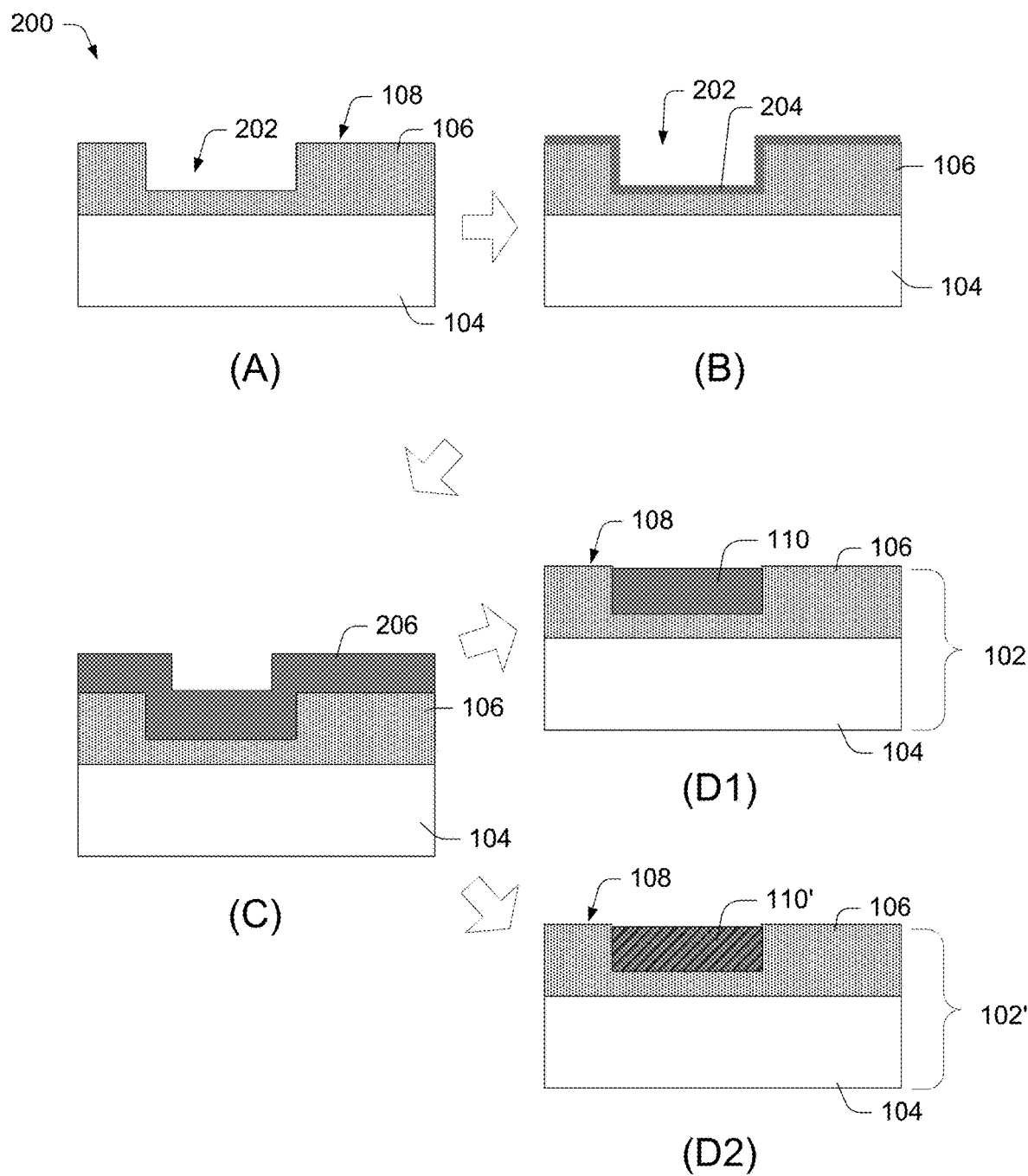
FIGS. 2 and 3 show an example process for forming and preparing dies or wafers for stacking and bonding, according to an embodiment.
Figure 3:
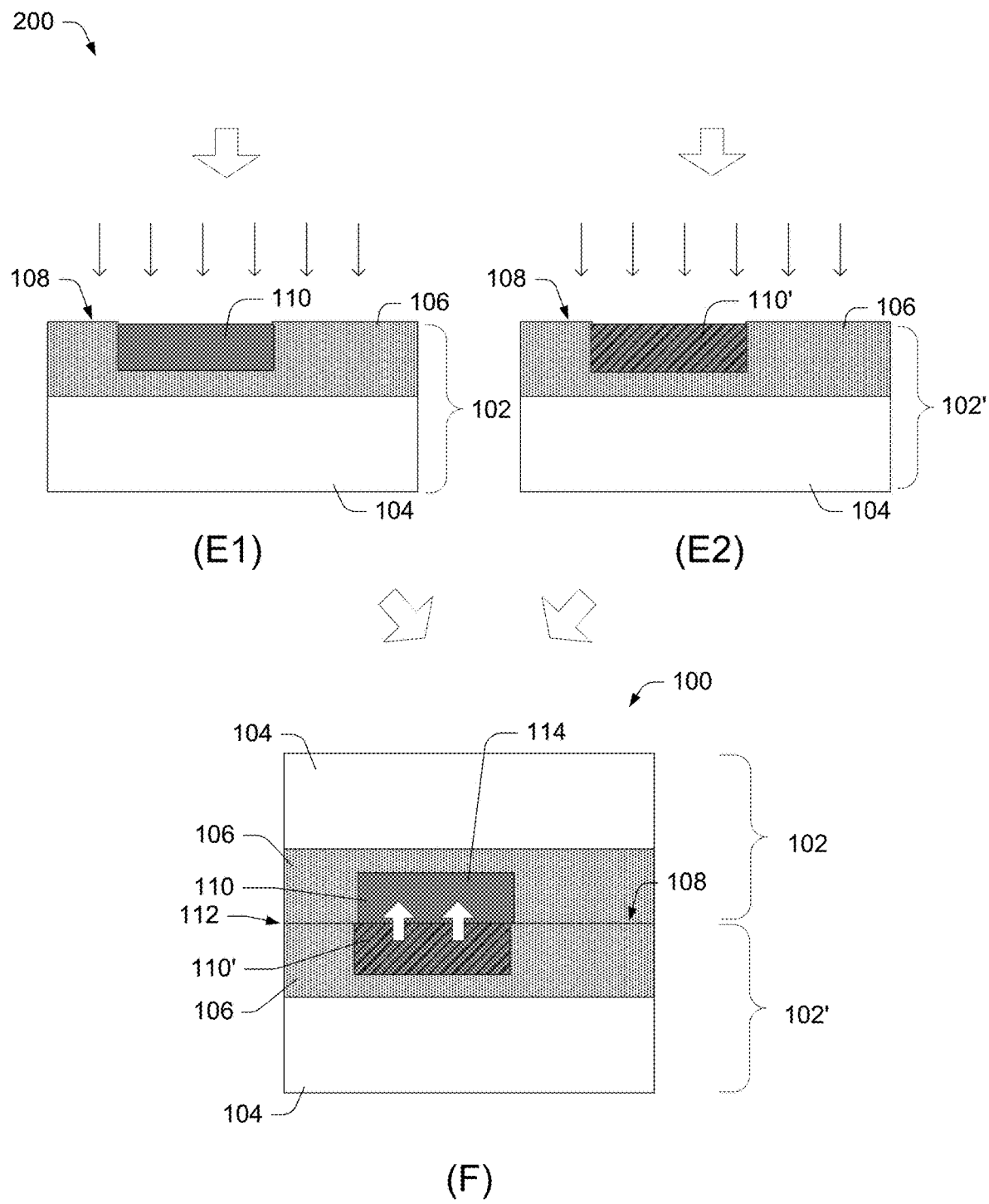

FIGS. 2 and 3 illustrate an example process 200 for forming and preparing dies 102 and 102' for stacking and direct hybrid bonding at lower temperatures (<220° C.), according to an embodiment. In the embodiment, the surface mobility and diffusion rates of the materials of the conductive features (110 and 110') are manipulated by adjusting the respective impurity concentrations of the materials of the conductive features (110 and 110'). Increasing the surface mobility and/or the diffusion rates at lower temperatures results in direct bonding of the conductive features 110 to 110' at the lower temperatures. The process 200 describes forming at least two dies that will be bonded together: a first die 102 and a second die 102'. The process 200 can be used to form as many dies (102 and 102') as desired, to form a multi-die stack 100 having any number of dies 102 and 102'.

As shown at FIG. 2, damascene processes (or the like) may be used to form the embedded conductive features 110 or 110' in the insulating layer 106 of the die 102 or 102'. The conductive features 110 and 110' may be comprised of metals (e.g., copper, etc.) or other conductive materials, or combinations of materials, and include structures, traces, pads, patterns, and so forth.

At block A, one or more trenches or cavities 202 are formed in the surface 108 of the insulating layer 106 of the die 102 or 102'. The cavities 202 may extend partly or fully through the thickness of the insulating layer 106, or may also extend into the base substrate 104 in some cases. In some examples, a barrier layer (not shown) may be deposited in the cavities 202 prior to depositing the material of the conductive features 110 or 110', such that the barrier layer is disposed between the conductive features 110 or 110' and the insulating layer 106. The barrier layer may be comprised of tantalum, titanium, tungsten layer or their combination with their various respective compounds or alloys, for example, or another conductive material, to prevent or reduce diffusion of the material of the conductive features 110 and 110' into the insulating layer 106.

As shown at block B, a seed layer 204 (of copper or a copper alloy, for example) may be deposited over the interior of the cavity 202, which may extend over the insulating layer 106. The seed layer 204 may be sputtered or otherwise disposed over the cavity 202, and may be 5 to 100 nanometers thick. In an embodiment, the seed layer 204 may have a texture orientation of {111}. In an embodiment, the seed layer 204 comprises the barrier layer.

At block C, a conductive layer 206 that is several microns thick is formed over the seed layer 204 and fills the cavity 202 to form the conductive features 110 or 110'. For example, the conductive layer 206 may comprise copper or a copper alloy, for example, and may be formed using a plating bath, such as an acid bath, or the like, and may fully or partially fill the cavity 202.

In one example, to form the conductive features 110 of the first die 102, the copper layer 206 is formed using a plating bath containing halide ions with no organic additives. In an embodiment, the conductive layer 206 is initiated using direct current (DC) plating current densities of between 10 and 30 mA/cm$^2$ and is finished with lower current densities, for instance less than 5 mA/cm$^2$. Also pulse plating current mode may be used to fill or overfill the cavity 202 with the conductive layer 206. However, it is desirable to suppress the incorporation of excess chloride impurities in the plated metal during the metal deposition step. A method to avoid incorporating unwanted chloride ions in the plated layer may include avoiding incorporating an electrolytic etching step or steps in the DC or pulse plating step or steps. In one embodiment, a plating current density or densities less than 10 mA/cm$^2$ may be used to fill the cavity. In some other applications, after filling the cavities of interest at lower current densities, for example, less than 10 mA/cm$^2$, higher current densities in the range of 10 to 50 mA/cm$^2$ may be applied to overfill the cavities.

Alternatively, the conductive layer 206 can be formed using a plating bath containing a copper complexing agent, for example copper citrate or copper gluconate, at current densities less than 5 mA/cm$^2$. Other techniques may also be used to form the copper layer 206.

As shown at block D1, the die 102 is planarized and polished (e.g., via CMP), to remove the excess of the conductive layer 206 and any other unwanted materials from the surface of the insulating layer 106, forming a planar bonding surface 108, which reveals the conductive features 110. The conductive features 110 can also be polished to form a flat surface for bonding. The planarization step may include annealing the conductive features 110 at temperatures between 40 and 200° C. in inert ambient or vacuum for times ranging from 30 minutes to 3 hours. Typically, the lower the annealing temperature, the longer the annealing times. The material of the conductive features 110 has a low concentration (less than 10 ppm or less than 5 ppm) of impurities or has no impurities, and may have a texture orientation of {111}. The conductive features 110 may be coplaner with the bonding surface or may be recessed below the bonding surface or may extend above the bonding surface.

In another example, to form the conductive features 110' of the second die 102', the copper layer 206 is formed using a plating bath containing halide ions with super-filling organic additives, using plating current densities of 2 to 40 mA/cm$^2$. Typical impurities can comprise carbon, nitrogen, oxygen, sulfur, etc., at a desired concentration typically below 50 ppm or preferably below 15 ppm for each of the incorporated impurities. In practice, depending on the nature of the organic super-filling additives, higher plating current densities tend to incorporate smaller additives concentrations. In an example, the impurities concentration may be between 5 ppm and 20 ppm.

As shown at block D2, the die 102' is planarized and polished (e.g., via CMP), to remove the excess of the conductive layer 206, any conductive barrier layer, and any other unwanted materials from the surface of the insulating layer 106, forming a planar bonding surface 108, which reveals the conductive features 110'. In some applications, the barrier layer may be non-conductive and may comprise, cover, or be incorporate the bonding surface 108. Also in some applications where the barrier layer is non-conductive, the non-conductive barrier layer may be selectively removed from the bottom of the cavities 202 before coating the cavities 202 with the seed layer 206. The conductive features 110' may be coplaner with the bonding surface or may be recessed below the bonding surface or may extend above the bonding surface.

The conductive features 110' can also be polished to form a flat surface for bonding. The planarization step may include annealing the conductive features 110' at temperatures between 40 and 200° C. in inert ambient or vacuum for times ranging from 30 minutes to 3 hours. Typically, the lower the annealing temperature, the longer the annealing times.

In an embodiment, the material of the conductive features 110' has a predetermined higher concentration of impurities than the conductive features 110. The texture of the surface of the conductive features 110' may have a (more or less) random orientation, based on the chemistry of the material of the conductive features 110'. Also, in an example, a proportion of the grains of the conductive features 110' with {111} orientation is lower than those of the conductive features 110 by at least 5%.

Forming a bonding surface 108 includes finishing the surface 108 to meet insulating layer 106 roughness specifications and metallic layer (e.g., conductive features 110 and 110') recess specifications (if specified), to prepare the surface 108 for hybrid bonding. In other words, the bonding surface 108 is formed to be as flat and smooth as possible, with very minimal (nanometer scale) surface topology variance. Various conventional processes, such as chemical mechanical polishing (CMP), dry or wet etching, and so forth, may be used to achieve the low surface roughness. Such processes provide the flat, smooth surface 108 that results in a reliable bond.

Referring to FIG. 3, at blocks E1 and E2, the bonding surfaces 108 of the dies 102 and 102' can be cleaned, rinsed, and prepared, using deionized water, oxygen or nitrogen plasma ashing and/or activation, or the like. In an embodiment, the surface of the conductive feature 110 may receive a deposition of {111} oriented copper, and the surface of the conductive feature 110' may receive a deposition of a more randomly textured (oriented) copper with a higher impurities concentration. At block F, the dies 102 and 102' are stacked with their respective bonding surfaces 108 brought together. The dies 102 and 102' may be direct hybrid bonded, for instance, without adhesive to each other, to make the desired physical and electrical connections while forming the stack or assembly 100.

Direct hybrid bonding includes direct insulator-to-insulator (e.g., dielectric-to-dielectric) bonding, without an adhesive or other intervening material, of the respective insulating layers 106 of each die 102 and 102' (e.g., ZIBOND®), as well as direct metal-to-metal bonding, also without an intervening material, of the respective conductive features 110 and 110' of each die 102 and 102' (e.g., DBI®). The dielectric-to-dielectric bonding occurs spontaneously as the respective bonding surfaces 108 are brought together at ambient temperatures. The metal-to-metal bonding (which may include diffusion between the metal of the conductive features 110 and 110') can occur with the aid of heat, however at a temperature lower than 220 degrees C. (e.g., 80 to 180 degrees C.) in this case.

Adding impurities to the materials (e.g., copper or copper alloy) of the conductive features 110' can change various physical properties of the materials. For example, the addition of some impurities (e.g., carbon, oxygen, nitrogen, sulfur, etc.) can improve the thermo-mechanical properties of the materials. With few exceptions, impurities concentration beyond a certain threshold tends to suppress room temperature grain growth in electroplated copper and gold. Conversely, reducing impurity concentration in plate copper or gold film does enhance grain growth at room temperature. In various implementations, adding impurities to some or all of the embedded conductive features 110' of the pair, or to a portion of each of the embedded conductive features 110' (at least at a portion of the bonding surface) creates an enhanced surface mobility reaction when it is bonded to another embedded conductive feature 110 with fewer or substantially no impurities, including at lower temperatures (e.g., <220 degrees C., or 80 to 180 degrees C.).

Accordingly, in various embodiments, the second conductive feature 110' with a higher concentration of impurities (e.g., less than 50 ppm of the various individual impurities) is bonded to the first conductive feature 110 with a lower concentration of impurities or with no impurities content. In an example, during lower temperature thermal treatment (e.g., <220 degrees C.) of the bonded conductive features 110' and 110, because of the significant impurities difference between the materials of the conductive features 110' and 110, impurities diffuse from the region with higher impurity concentration of the second conductive feature 110' across the bond line 112 to the lower impurities portion of the first conductive feature 110 (as illustrated by the arrows at block F). The enhanced diffusion results in the formation of the single conductive interconnect 114 at the lower temperatures.

In various embodiments, the bonding temperature may be controlled (e.g., reduced) by adjusting the concentration of impurities in one or both of the conductive features 110 and 110'. In an implementation, the bonding temperature may be reduced by reducing the concentration of impurities (such as C, O, N, S, and so forth) in the material of one of the conductive features 110 with respect to the other conductive feature 110'. For instance, the higher temperatures (>220°) associated with bonding copper interconnect structures may be reduced by reducing the concentration of impurities in at least a portion of some or all of the conductive features 110 to be bonded. Conversely, looking at a single bonding pair 110/110', the bonding temperature may be reduced by increasing the concentration of impurities of one of the conductive features 110' with respect to the other conductive feature 110.

In various other embodiments, the size of the grains of the respective materials of the conductive features 110 and 110' is manipulated, controlled, or adjusted to control the surface mobility and diffusion rates of the materials of the conductive features 110 and 110'. In the embodiments, the size of the grains may be controlled by adjusting the respective impurity concentrations of the materials of the conductive features 110 and 110'. Increasing the size of the grains of the material can increase surface mobility and/or the diffusion rates of the materials at lower temperatures, resulting in direct bonding of the conductive features 110 to 110' at the lower temperatures. As mentioned above, reducing the concentration of impurities in the materials can result in larger grain sizes (encourages grain growth), while increasing the concentration of impurities in the materials can result in smaller grain sizes (suppresses grain growth).

Figure 4:
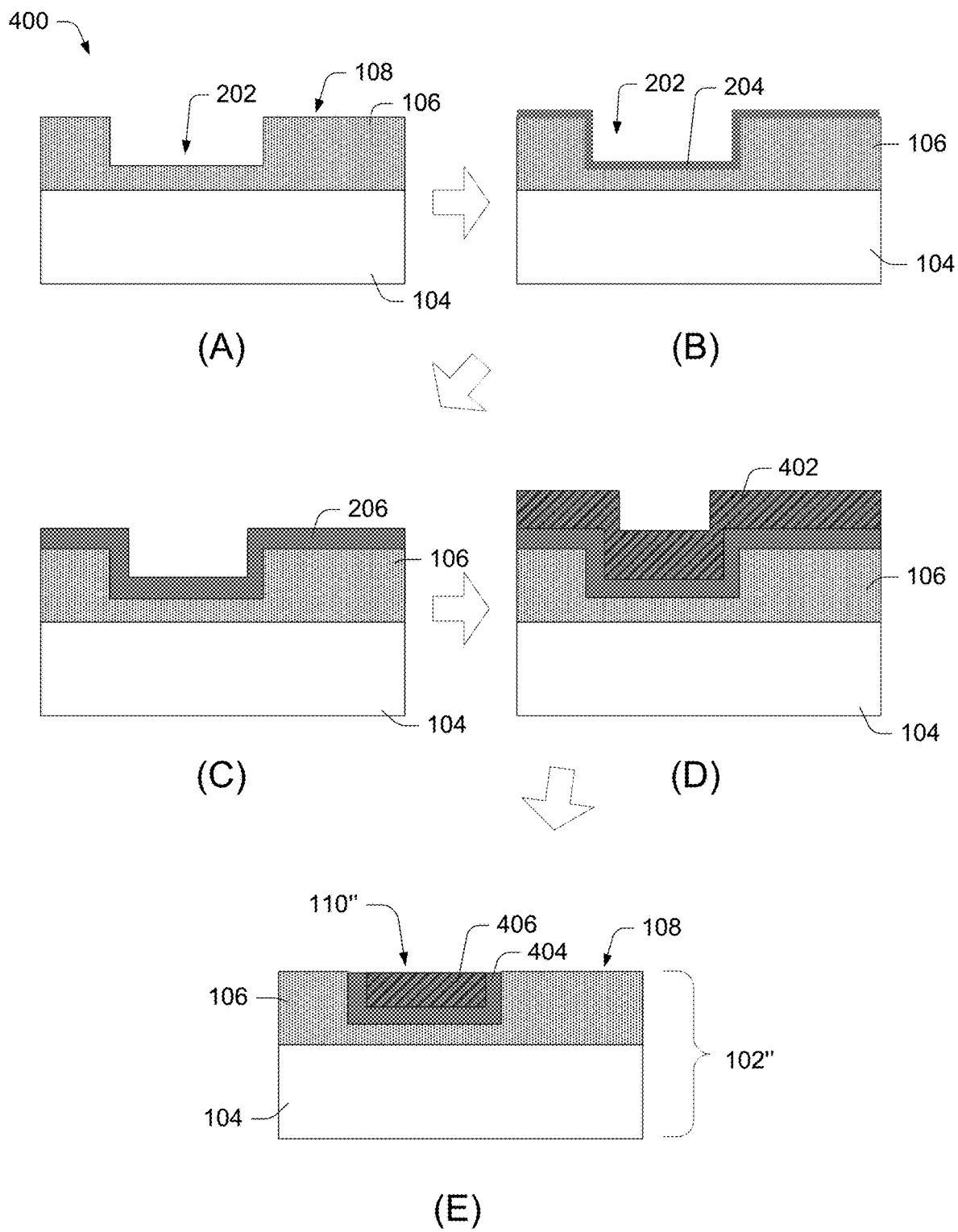
FIG. 4 shows an example process for forming and preparing dies or wafers for stacking and bonding, according to another embodiment.
Figure 5:
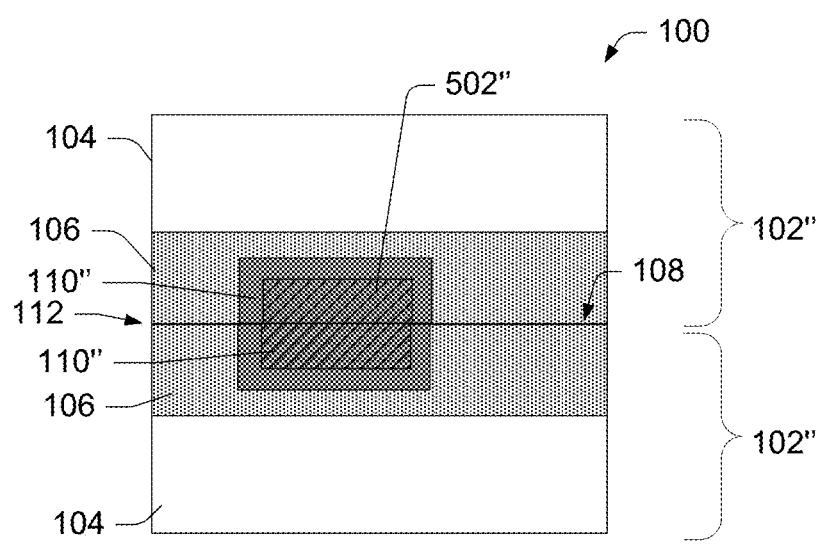
FIGS. 5-7 show examples of bonded dies or wafers, according to various embodiments.
Figure 6:
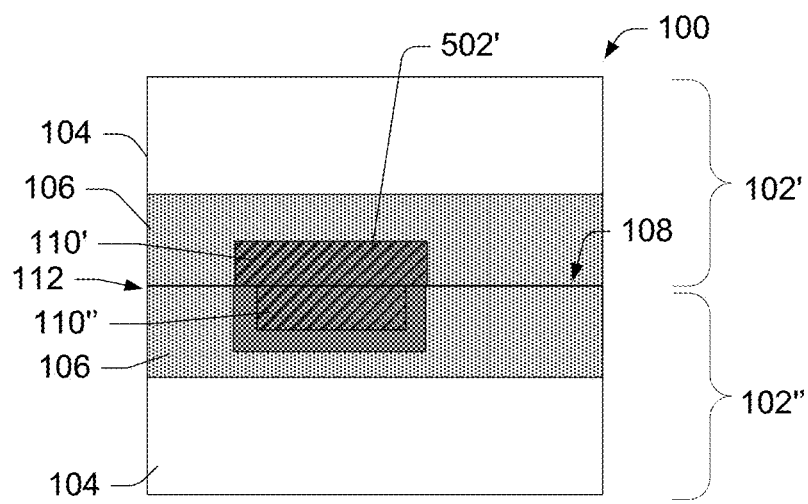
Figure 7:
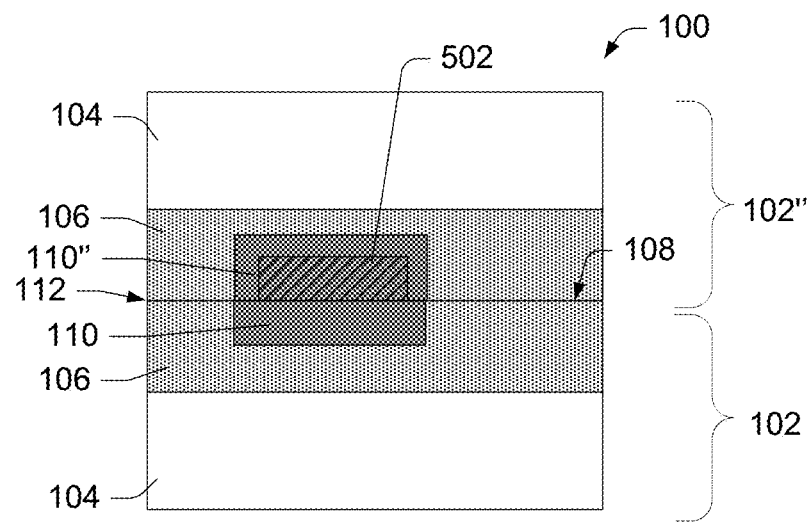

FIG. 4 illustrates an example process 400 for forming and preparing a die 102" for stacking and direct hybrid bonding at lower temperatures (<220° C.), according to an embodiment. In the embodiment, the surface mobility and diffusion rates of the materials of the conductive features (110") are manipulated by adjusting the respective impurity concentrations of the materials of the conductive sub-features (404 and 406) of the conductive features 110". Increasing the surface mobility and/or the diffusion rates at lower temperatures results in direct bonding of the conductive features 110" at the lower temperatures. The process 400 describes forming a die 102" that can be bonded to a like die 102", as well as to the first die 102 or the second die 102' (as shown at FIGS. 5-7). The process 400 can be used to form as many dies (102") as desired, to form a multi-die stack 100 having any number of dies 102".

As shown at FIG. 4, and similarly to the process 200 described with reference to FIG. 2, a damascene processes (or the like) may be used to form the embedded conductive features 110" in the insulating layer 106 of the die 102". The conductive features 110" may be comprised of metals (e.g., copper, etc.) or other conductive materials, or combinations of materials, and include structures, traces, pads, patterns, and so forth.

At blocks A and B, one or more trenches or cavities 202 are formed in the surface 108 of the insulating layer 106 of the die 102" as described above with reference to the process 200. In some examples, a barrier layer (not shown) comprised of tantalum, titanium, tungsten layer or their combination with their various respective compounds or alloys, for example, or another conductive material, may be deposited in the cavities 202 prior to depositing the material of the conductive features 110". A seed layer 204 (of copper or a copper alloy, for example) may be deposited (e.g., sputtered, etc.) over the interior of the cavity 202, typically 5 to 100 nanometers thick, which may extend over the insulating layer 106. In an embodiment, the seed layer 204 may have a texture orientation of {111}.

At block C, a conductive layer 206 is formed over the seed layer 204 and only partially fills the cavity 202 (e.g., about 80% filled, and preferably less than 400 nanometers below the bonding surface 108) to form the conductive sub-feature 404. The conductive layer 206 may comprise copper or a copper alloy, for example, and may be formed using a plating bath, such as an acid bath, or the like. In one example, the copper layer 206 is formed using a plating bath containing halide ions with no organic additives. In an embodiment, the conductive layer 206 is initiated using plating current densities of between 10 and 30 mA/cm$^2$ and is finished with lower current densities, for instance less than 5 mA/cm$^2$.

Alternatively, the conductive layer 206 can be formed using a plating bath containing a copper complexing agent, for example copper citrate or copper gluconate, at current densities less than 5 mA/cm$^2$. Other techniques may also be used to form the copper layer 206. The material of the conductive layer 206 has a low concentration of impurities or has no impurities, and may have a texture orientation of {111}.

At block D, a second conductive layer 402 is formed using a plating bath containing halide ions with super-filling organic additives, using plating current densities of 2 to 40 mA/cm$^2$. Typical impurities can comprise carbon, nitrogen, oxygen, sulfur, etc., at a desired concentration typically below 50 ppm or preferably below 15 ppm for each of the incorporated impurities. In one embodiment, the composition of the total impurities is less than 100 ppm in the second layer 402. The second layer 402 fills the remainder of the cavity 202 (preferably to a plated metal thickness less than 600 nm), to finish forming the conductive features 110". In an embodiment, the material of the second copper layer 402 has a predetermined higher concentration of impurities than the material of the copper layer 206. The texture of the surface of the second copper layer 402 is oriented significantly {111}, with a smaller fraction (less than 10%) of other textures.

The two-step filling process has the advantage of filling the cavities 202 without forming a void in the cavities 202. The first fill 206 of low/no impurity concentration copper fills the cavities 202 in a conformal layer, coating the walls and the floor of the cavities 202 substantially evenly. The second fill 402 of higher impurity concentration copper fills more from the bottom of the cavities 202, resulting in a more complete fill of the cavities 202 without leaving a void in the cavities 202. Further, making the first fill 206 thicker (e.g., about 80%) allows the second thinner fill 402 to substantially retain the grain orientation or texture of the underlying conductive layer 206, plated from an organic additive-free plating bath.

As shown at block E, the die 102" is planarized and polished (e.g., via CMP), to remove the excess of the conductive layer 206 and the second conductive layer 402, as well as any conductive barrier layer and any other unwanted materials from the surface of the insulating layer 106, forming a planar bonding surface 108. This reveals the conductive features 110", which is comprised of the sub-features 406 (having the materials of the second conductive layer 402) surrounded by the sub-features 404 (having the materials of the conductive layer 206). In other words, the conductive structure 110" is comprised of a first metal with a lower concentration or no impurities and a substantially {111} texture, beneath and surrounding a second metal having a higher concentration of impurities and a texture substantially similar to the texture of the first metal beneath.

In an alternate embodiment, after coating the cavity 202 with the first conductive layer 206 having a low impurity content and a known texture to substantially fill the cavity 202, a thinner second conductive layer comprising an alloy of the first conductive layer 206 may be applied to overfill the cavity 202. The choice of alloying element may be based on alloys that will enhance low temperature grain growth the least. The alloying element concentration of the second conductive layer can be less than 5%, and preferably less than 2%, and still preferably less than 0.5%. In one embodiment, the alloying element may comprise, for example cobalt, silver, or zinc, amongst other elements.

The conductive features 110" can also be polished to form a flat surface for bonding. The planarization step may include annealing the conductive features 110" at temperatures between 40 and 200° C. in inert ambient or vacuum for times ranging from 30 minutes to 3 hours. Typically, the lower the annealing temperature, the longer the annealing times.

Forming a bonding surface 108 includes finishing the surface 108 to meet insulating layer 106 roughness specifications and metallic layer (e.g., conductive features 110") recess specifications (if specified), to prepare the surface 108 for hybrid bonding. In other words, the bonding surface 108 is formed to be as flat and smooth as possible, with very minimal (nanometer scale) surface topology variance. Various conventional processes, such as chemical mechanical polishing (CMP), dry or wet etching, and so forth, may be used to achieve the low surface roughness. This process provides the flat, smooth surface 108 that results in a reliable bond.

Referring to FIG. 5, two of the dies 102" are stacked with their respective bonding surfaces 108 brought together. The dies 102" may be direct hybrid bonded, for instance, without adhesive to each other, to make the desired physical and electrical connections while forming the stack or assembly 100. The conductive features 110" of the respective dies 102" bond to form a single conductive interconnect 502".

In various implementations, adding impurities to one of the embedded conductive sub-features 406 of the pair of sub-features 404 and 406, or to a portion of the one of the embedded conductive sub-features 406 (at least at a portion of the bonding surface) creates an enhanced surface mobility reaction when it is layered with a surrounding embedded conductive sub-feature 404 with fewer or substantially no impurities.

In various embodiments, the bonding temperature of the conductive features 110" may be controlled (e.g., reduced) by adjusting the concentration of impurities in one or both of the conductive sub-features 404 and 406. In an implementation, the bonding temperature may be reduced by reducing the concentration of impurities (such as C, O, N, S, and so forth) in the material of one of the conductive sub-features 404 with respect to the other conductive sub-feature 406. For instance, the higher temperatures (>220°) associated with bonding copper interconnect structures may be reduced by reducing the concentration of impurities in at least a portion of one of the conductive sub-features 404. Conversely, the bonding temperature may be reduced by increasing the concentration of impurities of one of the conductive sub-features 406 with respect to the other conductive sub-feature 404.

In various other embodiments, the size of the grains of the respective materials of the conductive sub-features 404 and 406 is manipulated, controlled, or adjusted to control the surface mobility and diffusion rates of the conductive features 110". In the embodiments, the size of the grains may be controlled by adjusting the respective impurity concentrations of the materials of the conductive sub-features 404 and 406.

Similarly, with reference to FIG. 4, block E, at least one of the bonded embedded conductive features 110" shown in FIGS. 5-7 may comprise a first conductive layer 404 with a first grain texture with lower impurity content disposed within the lower portion of the cavity 202 and a second conductive layer 406 comprising an alloy of the first conductive layer 404 disposed over the first conductive layer 404. During the bonding operation or subsequent device use in the field, portions of the solute alloying element may diffuse from the alloy portion into the unalloyed portion.

Referring to FIG. 6, one of the dies 102' and one of the dies 102" are stacked with their respective bonding surfaces 108 brought together. The dies 102' and 102" may be direct hybrid bonded, for instance, without adhesive to each other, to make the desired physical and electrical connections while forming the stack or assembly 100. The conductive features 110' and 110" of the respective dies 102' and 102" bond to form a single conductive interconnect 502'.

Referring to FIG. 7, one of the dies 102 and one of the dies 102" are stacked with their respective bonding surfaces 108 brought together. The dies 102 and 102" may be direct hybrid bonded, for instance, without adhesive to each other, to make the desired physical and electrical connections while forming the stack or assembly 100. The conductive features 110 and 110" of the respective dies 102 and 102" bond to form a single conductive interconnect 502.

In various implementations, bonding a conductive feature 110' or conductive feature 110 to a conductive feature 110" creates an enhanced surface mobility reaction, based on the difference in impurities of the respective materials. In various embodiments, the bonding temperature for bonding conductive features 110" to conductive features 110' or to conductive features 110 may be controlled (e.g., reduced) by adjusting the concentration of impurities in one or both of the conductive sub-features 404 and 406, as well as within the conductive features 110' or the conductive features 110. For instance, the higher temperatures (>220°) associated with bonding copper interconnect structures may be reduced by reducing the concentration of impurities in at least a portion of one of the conductive sub-features 404 or the conductive features 110. Conversely, the bonding temperature may be reduced by increasing the concentration of impurities of one of the conductive sub-features 406 or the conductive features 110' with respect to the other conductive sub-feature 404 or the or the conductive features 110.

In various other embodiments, the size of the grains of the respective materials of the conductive sub-features 404 and 406 or the materials of the conductive features 110' or the conductive features 110 is manipulated, controlled, or adjusted to control the surface mobility and diffusion rates of the conductive features 110", 110', and/or 110. In the embodiments, the size of the grains may be controlled by adjusting the respective impurity concentrations of the materials of the conductive sub-features 404 and 406 or the conductive features 110' or 110.

Grain Orientation

Also, in various embodiments, the judicious choice or control of the metallographic textures or orientation of the grains at the bonding surface of one or both of the conductive features 110, 110', or 110" to be bonded, may be used to enhance bonding of the conductive features 110, 110', or 110" at lower temperatures (e.g., <220 degrees C.). For instance, a conductive feature 110, 110', or 110" having a very low concentration of impurities (or substantially no impurities) may have a texture with a high percentage (e.g., >97%) of {111} oriented grains. In contrast, a conductive feature 110, 110', or 110" having a higher concentration of impurities may have a texture with a more random arrangement of grain orientations, including {111}, {110}{200}, {222}, and {311}. In many cases, a more random texture at the bonding surface of conductive features 110, 110', or 110" has been associated with high electro-migration lifetimes. In practice, adequate electro-migration lifetimes in the bonded conductive features 110, 110', or 110" is quite desirable. Techniques have been developed to control the texture and microstructure of metallic (e.g., copper) structures, including grain orientations (see U.S. Pat. No. 6,333,120 to Dehaven et al.). These and other techniques may be used to form conductive features 110, 110', or 110" according to this disclosure, and are incorporated in their entirety.

Additionally, theoretical models for correlating the melting temperature of copper to the size of copper particles are available. The models predict that the temperature of the melting point decreases with the reduction in size of the copper particles. Further, grain growth can initiate at a lower temperature of 75° C. for {111} nano-crystalline copper in contrast to a higher temperature of 150° C. for {100} oriented nano-crystalline copper. Thus, grain orientation may be used to control grain growth and atom surface mobility in copper and copper alloy structures, which can also be used to lower the bonding temperature of conductive features 110, 110', and 110", as discussed above.

In various implementations, when the bonding surfaces 108 of two different dies (i.e., 102, 102', and 102") are brought together for mating, the opposing conductive features (i.e., 110, 110', and 110") are aligned for intimate contact with each other. The assembly 100 is processed at temperatures below 200° C. (e.g., 80°-180° C.) for metal-to-metal intimate coupling. During the thermal treatment step, the grains of opposing conductive features (i.e., 110, 110', and 110") touch, and metallic bonding occurs by grain growth or inter-grain growth. Also, portions of the impurities diffuse from the higher impurities portions of the conductive features 110' and 110" with more random grain orientation and into the portion of the conductive features (i.e., 110, 110', and 110") with comparatively lower impurities and {111} grain orientation.

The incorporation of impurities into a conductive feature 110 with {111} orientation improves the electromigration of the conductive feature 110. Impurity gradients are formed as impurities diffuse from the higher impurity concentration material (which has a random texture) to the lower impurity concentration material (which has a high {111} orientation) across the bond line 112 during the annealing step. Longer annealing times tend to reduce the slope of the impurity gradients. The comparatively lower bonding temperatures may be mostly due to the higher surface mobility of copper atoms of the {111} planes at lower temperatures compared to other orientations such as {100} or {110}. Also the lower impurities content of the conductive features 110 (or the sub-features 406) did not impede grain growth process.

Additional embodiments may include a bonded interconnect comprising a first conductive layer with a first grain texture (e.g., grain orientation) bonded to a second conductive layer with a second grain texture, where the two grain textures are different. Similarly, an embodiment may include a bonded interconnect comprising a first conductive layer with a first impurity concentration and first texture bonded to a second conductive layer with a second grain texture, where the two grain textures are different.

Nanotexturing

Figure 8:
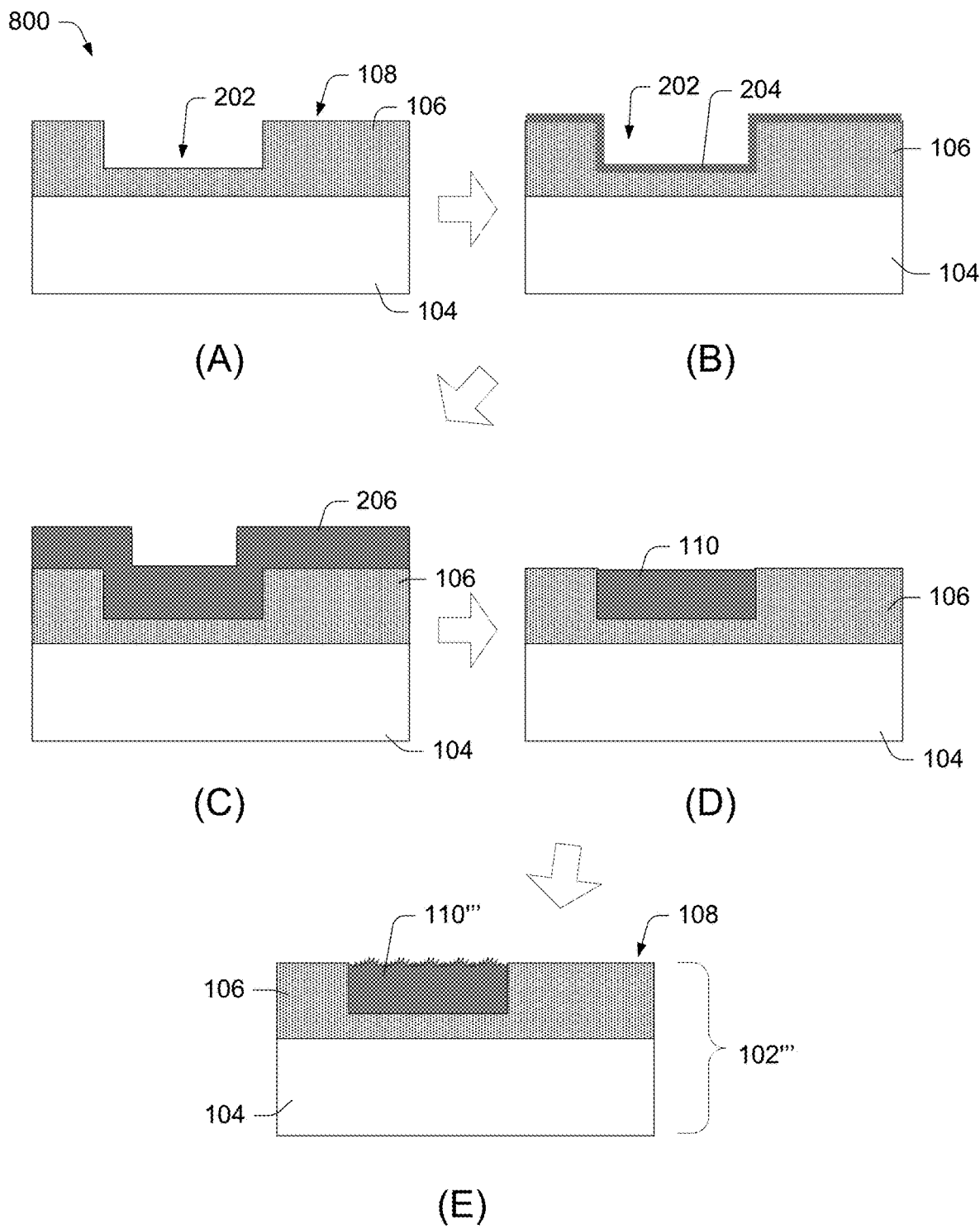
FIGS. 8 and 9 show an example process for forming and preparing dies or wafers for stacking and bonding, according to another embodiment.
Figure 9:
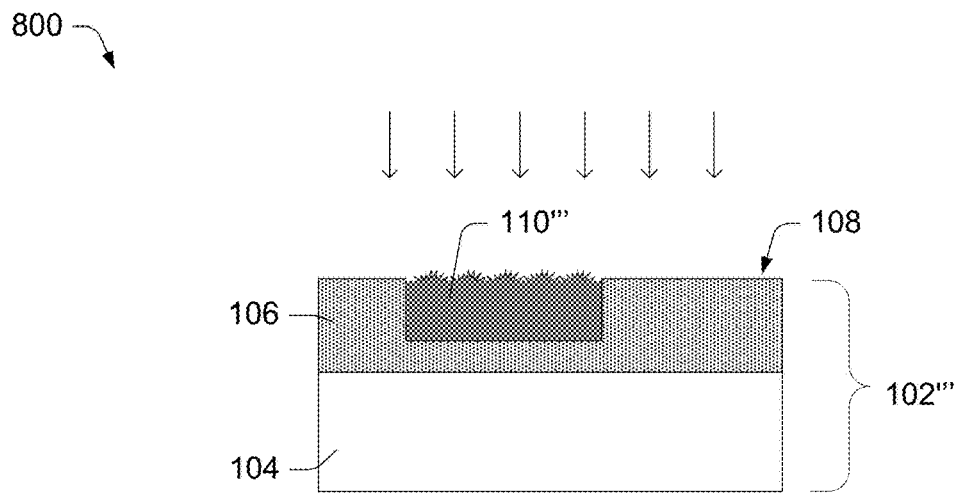
Figure 9:
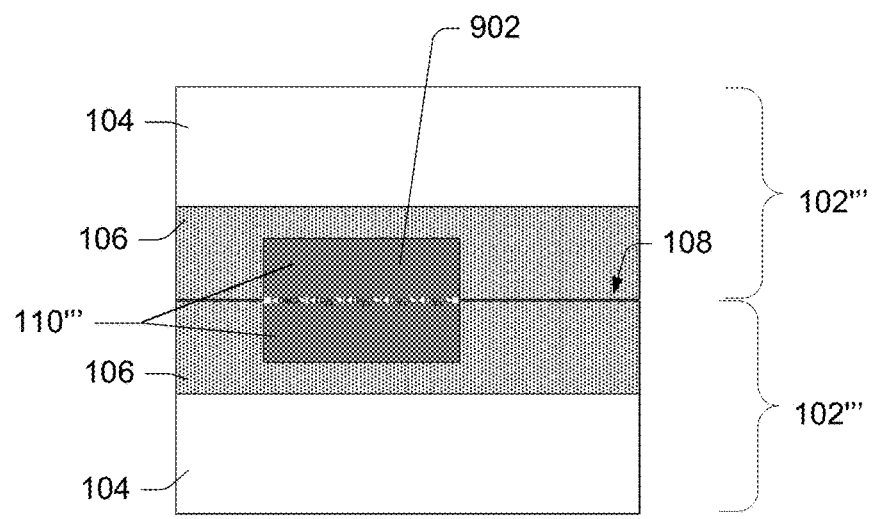

FIGS. 8 and 9 illustrate an example process 800 for forming and preparing dies 102' for stacking and direct hybrid bonding at lower temperatures (<220° C.), according to an embodiment. In the embodiment, the surface mobility and diffusion rates of the materials of the conductive features 110''' are determined or manipulated by deliberately forming nano-scale microstructures (nanotextures) on the bonding surface of one or both conductive structures 110' to enhance the bonding process.

According to the process 800, a die 102 is formed having one or more conductive features 110, as described in the process 200, blocks A to D1. The resulting metal plating 110 has very low to substantially no impurities, and has a texture that is typically {111} oriented. In alternate implementations, the process may form a die 102' having one or more conductive features 110', as described in the process 200, blocks A to D2, or a die 102" having one or more conductive features 110", as described in the process 400, blocks A to E.

While at block D, the microstructure of the conductive features 110 may be stabilized (e.g., by annealing) and then planarized. At block E, the planarized metal surface of the conductive features 110 is treated (e.g., by nanotexturing) to form nano-scale microstructures on the {111} textured surfaces, forming conductive features 110'''. For example, in an embodiment, the surface is treated with a very dilute sulfuric acid or methane sulfonic acid rinse, less than 2% and preferably less than 0.5%, and is spin dried in an oxygen ambient environment for less than 30 seconds, followed by a deionized water rinse and drying. In one embodiment, this forms screw dislocations on the surface of the conductive features 110'''.

In another embodiment, the surface of the conductive features 110 is rinsed in a low acid concentration copper sulfate plating solution, and spun dried in an oxygen ambient environment for less than 30 seconds, followed by a dilute acid rinse and then a deionized water rinse. In other embodiments, organic alcohols such as isopropanol, glycerol, or the like may be added the acid solution to form a shallower textured surface. Other techniques may be used to form the nano-scale microstructures on the planarized surface of the conductive features 110'''. The nano-texturing forms embedded copper nano-fingers or particles on the modified surface of the conductive features 110'''.

Referring to FIG. 9, at block F, the process 800 includes cleaning, rinsing, and/or activating the dielectric bonding surface 108 of the die 102' in preparation for bonding. A second die 102' with an embedded conductive feature 110''' may be prepared similarly for bonding to the first die 102'''. At block G, the two dies 102''' are assembled, including stacking the dies 102' with the bonding surfaces 108 together and aligning the conductive features 110' of each die 102'''. The dies 102''' are direct bonded without adhesive, and the conductive features 110' are bonded together using a low temperature (less than 200° C.) to form a continuous conductive interconnect 902. The nanotexturing of the bonding surfaces of the conductive features 110''' allows for greater surface mobility of the metal atoms at the embedded nano-copper layer on the surface of the conductive features 110''', which enhances bonding at comparatively lower temperatures of less than 220° C.

Surface Peening

Figure 10:
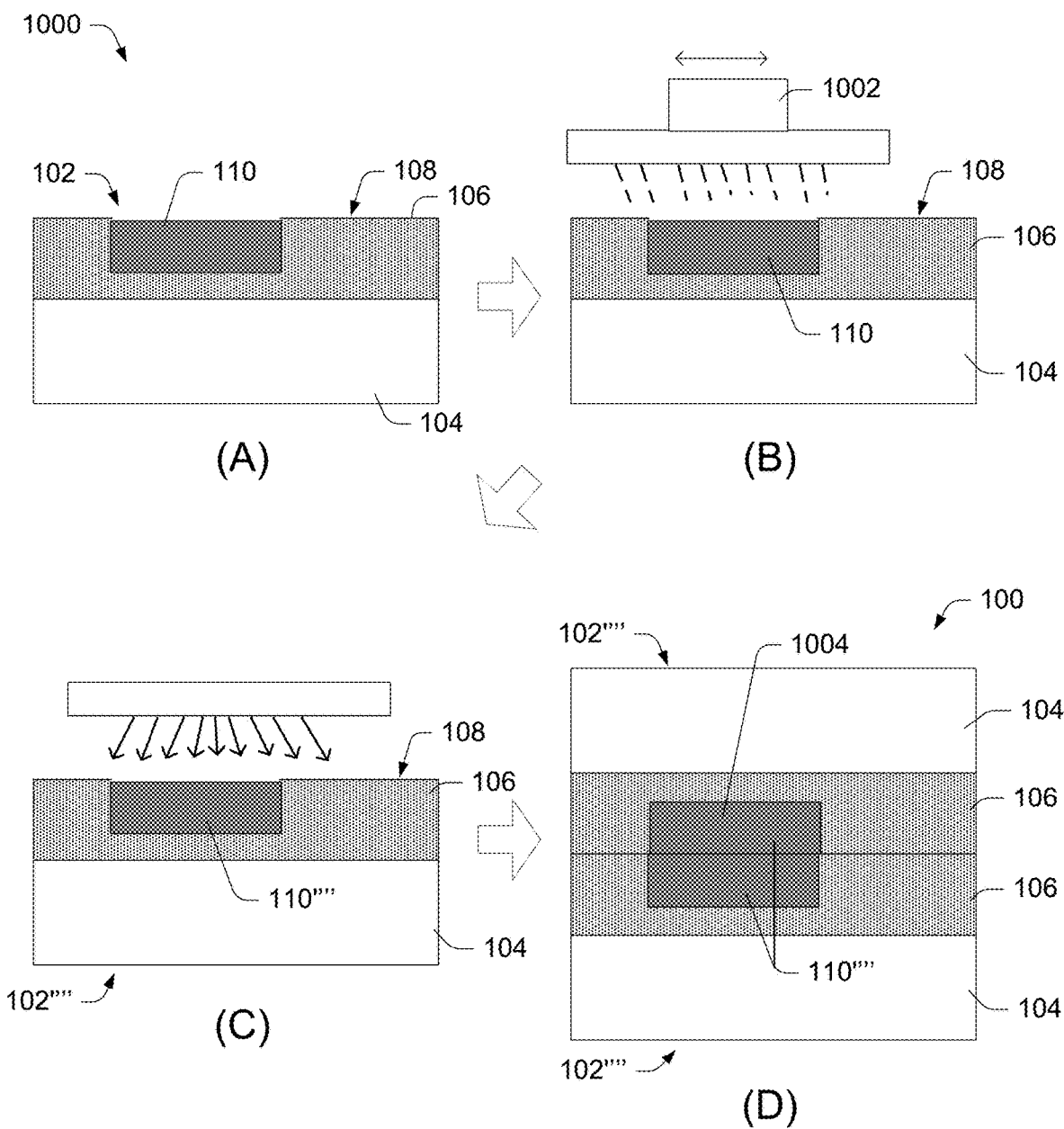
FIG. 10 shows an example process for forming and preparing dies or wafers for stacking and bonding, according to another embodiment.

FIG. 10 illustrates an example process 1000 for forming and preparing dies 102''' for stacking and direct hybrid bonding at lower temperatures (<220° C.), according to an embodiment. In the embodiment, the surface mobility and diffusion rates of the materials of the conductive features 110''' are determined or manipulated by impacting the bonding surface of one or both conductive structures 110' to enhance the bonding process.

According to the process 1000, a die 102 is formed having one or more conductive features 110, as described in the process 200, blocks A to D1. The resulting metal plating 110 has very low to substantially no impurities, and has a texture that is typically {111} oriented. In alternate implementations, the process may form a die 102' having one or more conductive features 110', as described in the process 200, blocks A to D2, or a die 102" having one or more conductive features 110", as described in the process 400, blocks A to E.

A resulting die 102 with one or more conductive features 110 is shown at FIG. 10, block A. At block B, the surface of the conductive features 110 is peened using a medium dispensed from a component 1002, which may move in a pattern over the surface of the die 102. In an implementation, the peening medium may comprise a high pressure fluid, such as deionized water, liquid nitrogen, or the like. In other implementations, other media may be used to peen the surface of the conductive features 110.

The goal of the peening is to cold work the surface of the conductive features 110, and to reduce the grain sizes of the grains of the conductive material of the conductive features 110. This forms the conductive features 110"" and the die 102"".

At block C, the process 1000 includes cleaning, rinsing, and/or activating the dielectric bonding surface 108 of the die 102"" in preparation for bonding. A second die 102"" with an embedded conductive feature 110"" may be prepared similarly for bonding to the first die 102"". Alternately, the die 102"" may be bonded to a die 102, a die 102', or a die 102" as desired.

At block D, the two dies 102"" are assembled, including stacking the dies 102"" with the bonding surfaces 108 together and aligning the conductive features 110"" of each die 102"". The dies 102"" are direct bonded without adhesive, and the conductive features 110"" are bonded together using a low temperature (less than 200° C.) to form a continuous conductive interconnect 1004.

In various embodiments the peening of the bonding surfaces of the conductive features 110"" provides for greater surface mobility of the metal atoms at the surface of the conductive features 110"", which enhances bonding at comparatively lower temperatures of less than 220° C. Additionally, the cold working of the surface of the conductive features 110"" stores energy and compressive stress in the material of the conductive features 110"". This energy may be released during bonding, to enhance the bonding process. In an embodiment, vacancies between the grain boundaries are annihilated as the grains are cold worked. In some cases, this process includes grain growth among the grains, with smaller grains becoming larger, as the vacancies are eliminated.

Although various implementations and examples are discussed herein, further implementations and examples may be possible by combining the features and elements of individual implementations and examples. In various embodiments, some process steps may be modified or eliminated, in comparison to the process steps described herein.

The techniques, components, and devices described herein are not limited to the illustrations of FIGS. 1-10, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method, comprising:
   forming a first cavity in a bonding surface of a first substrate;
   coating the first cavity with a barrier layer and a seed layer;
   filling the first cavity with a conductive material having a first concentration of impurities to form a first conductive interconnect structure;
   forming a planar bonding surface on the first substrate;
   forming a second cavity in a bonding surface of a second substrate;
   coating the second cavity with a barrier layer and a seed layer;
   filling the second cavity with a conductive material having a second concentration of impurities to form a second conductive interconnect structure, the second concentration of impurities being different from the first concentration of impurities;
   forming a planar bonding surface on the second substrate;
   bonding the first substrate to the second substrate via direct bonding without adhesive; and
   bonding the first conductive interconnect structure to the second conductive interconnect structure.

2. The method of claim 1, further comprising partially filling the first cavity with the conductive material having the first concentration of impurities, and filling the remainder of the first cavity with the conductive material having a concentration of impurities that is different than the first concentration of impurities.

3. The method of claim 1, further comprising partially filling the second cavity with the conductive material having the first concentration of impurities, and filling the remainder of the second cavity with the conductive material having a different concentration of impurities than the first concentration of impurities.

4. The method of claim 1, further comprising bonding the first conductive interconnect structure to the second conductive interconnect structure at a temperature between 80° and 200° C.

5. The method of claim 1, wherein the second concentration of impurities is at least one order of magnitude greater than the first concentration of impurities.

6. The method of claim 1, wherein the impurities of the first concentration of impurities and/or the second concentration of impurities comprise one or more of: carbon, oxygen, nitrogen, and sulfur.

7. The method of claim 1, further comprising forming a texture, including a grain orientation, of a bonding surface of the first conductive interconnect structure to be different from a texture, including a grain orientation, of a bonding surface of the second conductive interconnect structure.

8. The method of claim 1, further comprising causing the impurities of the conductive material of the second conductive interconnect structure to diffuse into at least a portion of the conductive material of the first conductive interconnect structure at a bond line joining the second conductive interconnect structure to the first conductive interconnect structure.

9. The method of claim 1, wherein the seed layer comprises sputtered copper having a texture orientation of {111}.

10. A method, comprising:
   forming a first cavity in a bonding surface of a first substrate;
   coating the first cavity with a barrier layer and a seed layer;
   filling the first cavity with a conductive material to form a first conductive interconnect structure;
   texturing a bonding surface of the first conductive interconnect structure to define a first texture on the bonding surface of the first conductive interconnect structure;
   forming a second cavity in a bonding surface of a second substrate;
   coating the second cavity with a barrier layer and a seed layer;
   filling the second cavity with a conductive material to form a second conductive interconnect structure, a bonding surface of the second conductive interconnect structure having a second texture different from the first texture;
   intimately bonding the first substrate to the second substrate; and
   intimately bonding the bonding surface of the first conductive interconnect structure to the bonding surface of the second conductive interconnect structure.

11. The method of claim 10, further comprising:
   rinsing the bonding surface of the first and/or second conductive interconnect structures with diluted acid;
   spin drying the first and/or second conductive interconnect structures in an oxygen ambient environment; and
   rinsing and drying the bonding surface of the first and/or second conductive interconnect structures with deionized water.

12. The method of claim 10, further comprising:
   rinsing the bonding surface of the first and/or second conductive interconnect structures with a low acid concentrate copper sulfate solution;
   spin drying the first and/or second conductive interconnect structures in an oxygen ambient environment;
   rinsing the bonding surface of the first and/or second conductive interconnect structures with diluted acid; and
   rinsing and drying the bonding surface of the first and/or second conductive interconnect structures with deionized water.

13. The method of claim 10, further comprising bonding the first conductive interconnect structure to the second conductive interconnect structure at a temperature less than 200° C.

* * * * *